United States Patent [19]

Hoover

[11] 4,117,415
[45] Sep. 26, 1978

[54] BRIDGE AMPLIFIERS EMPLOYING COMPLEMENTARY TRANSISTORS

[75] Inventor: Merle Vincent Hoover, Flemington, N.J.

[73] Assignee: RCA Corporation, New York, N.Y.

[21] Appl. No.: 787,701

[22] Filed: Apr. 14, 1977

[51] Int. Cl.² ............................................. H03F 3/18
[52] U.S. Cl. ................................... 330/264; 330/146; 330/269; 330/277
[58] Field of Search ............... 330/146, 263, 264, 269, 330/277, 295

[56] References Cited

U.S. PATENT DOCUMENTS

| | | | |
|---|---|---|---|
| 3,258,704 | 6/1966 | Wittman | 330/263 |
| 3,808,545 | 4/1974 | Stanley | 330/297 X |
| 3,872,390 | 3/1975 | Nash | 330/264 |
| 3,927,333 | 12/1975 | Furuhashi | 330/263 X |
| 4,021,751 | 5/1977 | Suzuki | 330/264 X |

Primary Examiner—Lawrence J. Dahl
Attorney, Agent, or Firm—H. Christoffersen; Samuel Cohen

[57] ABSTRACT

The amplifiers of the present application all include at least two pairs of complementary, metal-oxide-semiconductor (COS/MOS) transistors, each pair quiescently biased to operate as a linear amplifier. An input signal is applied in one phase to the input circuit of one COS/MOS pair and in opposite phase to the input circuit of the other COS/MOS pair. The output signal appears across a load circuit which is connected at one terminal to the joined drain electrodes of one COS/MOS pair and at its other terminal to the joined drain electrodes of the other COS/MOS pair.

44 Claims, 4 Drawing Figures

BRIDGE AMPLIFIERS EMPLOYING COMPLEMENTARY TRANSISTORS

This invention relates to bridge amplifiers.

The innate characteristics of four-armed balanced (or nulled) networks have been harnessed by practitioners of electrical circuits since the 19th century, e.g., the Wheatstone Bridge employing four resistors. The advent of vacuum tubes permitted further exploitation of the bridge configuration. So-called push-pull amplifiers are a form of bridge amplifier Differential amplifiers, now one of the basic building clocks of linear integrated circuits, were also originally implemented with vacuum tube electronics; they are likewise a variant of the basic bridge amplifier.

The bridge amplifiers embodying the present invention employ complementary transistors. A number of different examples are illustrated and their important features are pointed out in the detailed discussions below.

Figure 1:
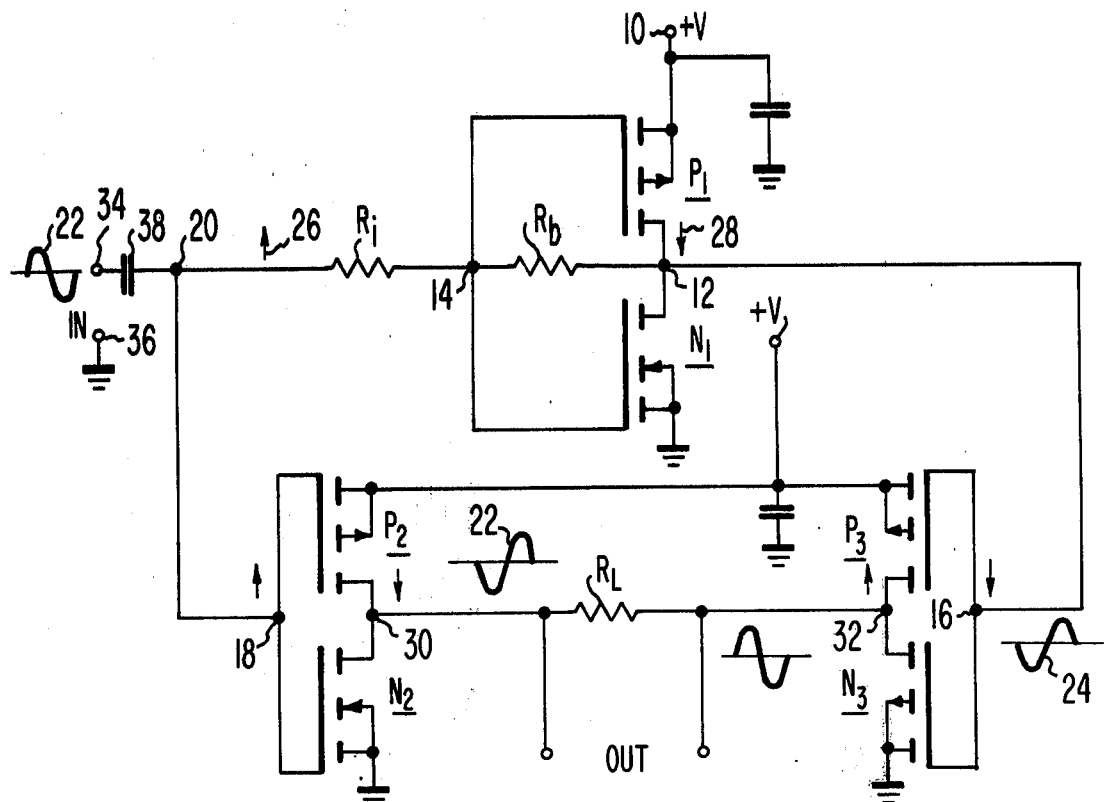
FIG. 1 is a schematic circuit diagram of a bridge amplifier embodying the invention.

The amplifier of FIG. 1 includes three pairs of field-effect transistors comprising COS/MOS transistors $P_1$, $N_1$; $P_2$, $N_2$; and $P_3$, $N_3$. Each pair is connected to operate as a linear amplifier. Here and in the remaining figures the P designations indicate P-channel transistors and the N designations indicate N-channel transistors.

The transistor $P_1$ of the first pair is connected at its source (input) electrode and substrate connection to terminal 10 for an operating voltage $+V$ and is connected at its drain (output) electrode to node 12 and to the drain electrode of transistor $N_1$. N-channel transistor $N_1$ is connected at its source electrode and substrate connection to the second terminal for the operating voltage source, shown here as circuit ground. The gate (control) electrodes of this COS/MOS pair are connected to circuit point 14. These gate electrodes are maintained at a quiescent bias level of $(+V/2)$ by the bias resistor $R_b$ which connects the common drain electrode connection 12 to the common gate electrode connection 14.

The circuit just described operates as a unity gain inverter. Its purpose is to drive the remainder of the amplifier, which is to be described below, and also to provide the proper bias voltages to effect linear operation of the various COS/MOS pairs. As already implied, quiescent current flowing through the series-connected conduction paths of transistors $P_1$ and $N_1$, places node 12 at $(+V/2)$ and this same voltage is applied by bias resistor $R_b$ to the two gate electrodes of this pair. Similarly, the voltage $(+V/2)$ at node 12 appears at the common gate electrode connection 16 of the transistor pair $P_3$, $N_3$. Also, this same voltage is applied by the input resistor $R_i$ to the common gate electrode connection 18 of the transistor pair $P_2$, $N_2$. This bias level provides linear Class A operation of the two transistor pairs $P_2$, $N_2$ and $P_3$, $N_3$, respectively.

Unity gain operation of the first COS/MOS pair $P_1$, $N_1$, is established by appropriate choice of the ratio $R_b/R_i$ of the bias and input resistors, respectively. This ratio is selected in accordance with the classical expression $(A/1-A\beta)$ for the voltage amplification produced by the amplifier taking into account feedback, where A is the amplification provided by the COS/MOS pair in the absence of feedback and $\beta$ is the fraction of the output voltage that is fed back to the input terminal of the amplifier. The value of $\beta$ is dependent upon the ratio of $R_b/R_i$. Since the amplifier just described is a unity-gain amplifier, it should be clear that the amplitude of the signal appearing at the input terminal 20 to the amplifier, is equal to that of the signal appearing at the output terminal 12 of the amplifier $P_1$, $N_1$. Further, as the unity-gain amplifier is an inverting type amplifier, the signal at 12 is complementary to that at 20. This is indicated both by the wave shapes 22 and 24 and the arrows 26 and 28.

The bridge itself comprises the two COS/MOS pairs $P_2$, $N_2$ and $P_3$, $N_3$, respectively. The non-inverted signal is applied to the common gate electrode connection 18 of the pair $P_2$, $N_2$ and the inverted signal is applied to the common gate electrode connection 16 of the pair $P_3$, $N_3$. The load $R_L$, illustrated schematically as a resistor, is connected at one terminal to the common drain electrode connection 30 of the transistor pair $P_2$, $N_2$ and at its other terminal to the common drain electrode connection 32 of the transistor pair $P_3$, $N_3$.

In operation, the input signal 22 shown schematically as one period of a sinusoid, is a single-ended signal which is applied between input terminals 34 and 36, the latter terminal being at circuit ground. This signal is applied through capacitor 38 to input terminal 18 of the $P_2$, $N_2$ pair. A complementary signal 24 of the same amplitude is applied by the unity-gain amplifier to the common gate electrode connection 16 of the transistor pair $P_3$, $N_3$. The transistor pair $P_2$, $N_2$ inverts and amplifies the input signal and applies the same to load $R_L$. The amplifier $P_3$, $N_3$ inverts and amplifies the complementary signal 24 and applies the same to the other terminal 32 of the load $R_L$. Thus, a signal of one phase appears at one of the output terminals and a signal of opposite phase at the other output terminal. In other words, the circuit has converted the single-ended input signal to an amplified, double-ended output signal which is a replica of the input signal.

It has been assumed, for purpose of explanation, that the PMOS transistors shown in FIG. 1 have similar matched characteristics and that the NMOS transistors likewise have similar characteristics. This is readily accomplished in practice, for example by manufacturing the circuit on a common semiconductor substrate, that is, by assuming the circuit to be integrated, as is preferred. It is also assumed that the PMOS and NMOS transistors are truly complementary, that is, that their conductivities are mutually complementary.

The circuit of FIG. 1, and the others which follow, offer important advantages over circuits using complementary bipolar transistors. These include high input impedance, high dynamic range of input signal voltage, square law operating characteristics, relative freedom from thermal runaway, and freedom from "second breakdown" characteristics. Another feature of the present circuits, when implemented with COS/MOS transistors, is that they are much more easily integrated onto a common semiconductor substrate than truly complementary bipolar transistors.

Figure 2:
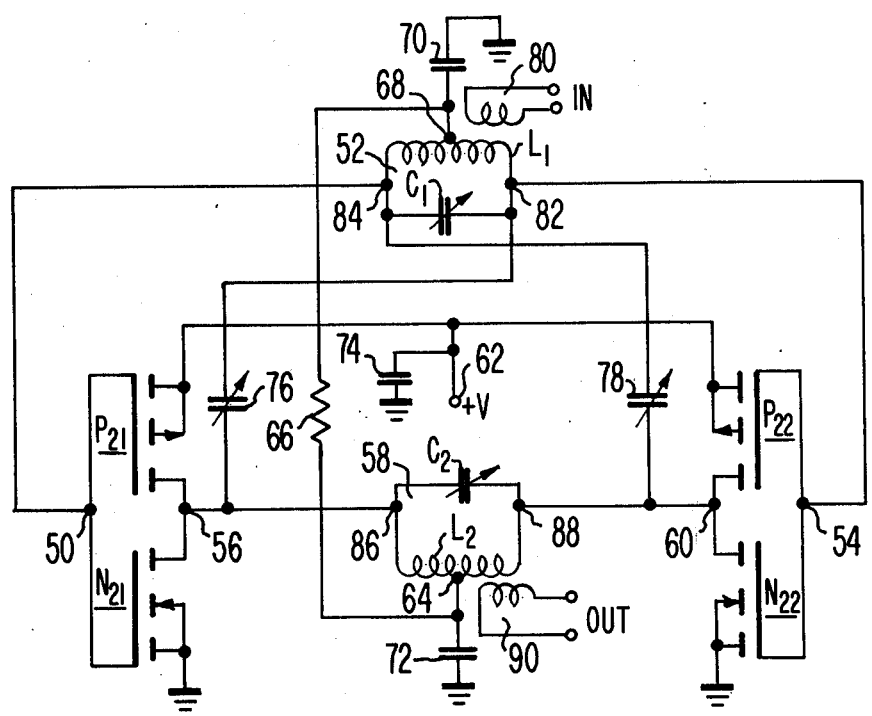
FIG. 2 is a schematic circuit diagram of a common-source bridge amplifier comprising a second embodiment of the invention.

One of the major advantages of bridge-type amplifiers, in general, is that under zero signal conditions, the DC current through the load is zero, assuming idealized circuit execution. The driving signal introduces an imbalance in the amplifier and thereby generates a signal current in the load. The circuit of FIG. 1 is an example of the manner in which a bridge-type amplifier can be used to drive such a load directly without using a coupling capacitor or transformer while still maintaining zero current flow through the load under zero signal conditions. The circuit of FIG. 1 is useful at frequencies of the order of up to 10 MHz or so with current state-of-the-art COS/MOS transistors. Neutralization techniques such as shown in FIG. 2, which will be discussed next, permit operation at higher frequencies. It is expected, for example, that the circuit of FIG. 2 will operate at frequencies of the order of up to 100 MHz.

The circuit of FIG. 2 is a bridge-type amplifier using tuned circuits and would be suitable, for example, as a radio frequency (RF) amplifier. The COS/MOS transistors $P_{21}$, $N_{21}$ and $P_{22}$, $N_{22}$ are operated as Class A amplifiers and are connected in the common-source mode, that is, with their source electrodes connected to RF ground.

The gate electrodes of the transistor pair $P_{21}$, $N_{21}$, are connected to a node 50 which connects to one terminal 84 of a parallel resonant circuit 52 which comprises inductor $L_1$ and tunable capacitor $C_1$. The common gate electrode connection 54 of the other transistor pair $P_{22}$, $N_{22}$ connects to the other terminal 82 of this parallel resonant circuit. The common drain electrode connection 56 of the pair $P_{21}$, $N_{21}$, connects to one terminal 86 of parallel resonant circuit 58. This circuit comprises inductor $L_2$ and tunable capacitor $C_2$. The common drain electrode connection 60 of the other transistor pair $P_{22}$, $N_{22}$ connects to the other terminal 88 of this parallel resonant circuit.

As in the previous circuit, both COS/MOS pairs are quiescently biased at a voltage level (+V/2), where +V is the operating voltage at terminal 62. The quiescent current path is from this terminal through the conduction paths of both transistor pairs so that, assuming equal conduction quiescently through the P and N transistors of each pair, both node 56 and node 60 are at (+V/2). Accordingly, this same voltage level appears at the center tap 64 of inductor $L_2$. This voltage level, therefore, is applied from this tap through bias resistor 66 and through the center tap 68 of inductor $L_1$ to the gate electrode connections 50 and 54, respectively.

The capacitors 70, 72 and 74 are simply by-pass capacitors. Note that capacitor 74 maintains the source electrodes of the P type transistors at RF ground and that the source electrodes of the N type transistors are directly connected to ground.

The purpose of the cross-coupled neutralization network comprising tunable capacitors 76 and 78, is to improve the stability of the high frequency operation of the circuit. In such higher frequency operation, the drain-to-gate feedback capacitance ultimately adversely affects the amplifier's performance in that the regenerative feedback through these paths can make the circuit unstable. The out-of-phase feedback through the capacitors of the neutralization network counteracts this instability.

In one mode of operation of the circuit, both parallel-resonant circuits are tuned to the input signal frequency.

The input signal is applied to primary winding 80. It results in a signal of one phase at terminal 82 of the resonant circuit 52 and a signal of opposite phase at terminal 84 of the parallel resonant circuit. These out-of-phase signals are applied to the common gate electrode connections 54 and 50, respectively, of amplifiers $P_{22}$, $N_{22}$ and $P_{21}$, $N_{21}$, respectively. The amplifiers invert and amplify these two signals and apply the same to opposite terminals 86 and 88 of the parallel resonant circuit 58. The output signal is available at the secondary winding 90 which is coupled to the inductor $L_2$ of the resonant circuit 58.

The circuit of FIG. 2 is also useful as a frequency multiplier. In this mode of operation, the output parallel resonant circuit 58 is tuned to a desired odd-number multiple of the fundamental input driving frequency applied to the input parallel resonant circuit 52. Even-number multiples (harmonics) of the fundamental input driving frequency are cancelled in the output circuit by the push-pull circuit configuration.

Figure 3:
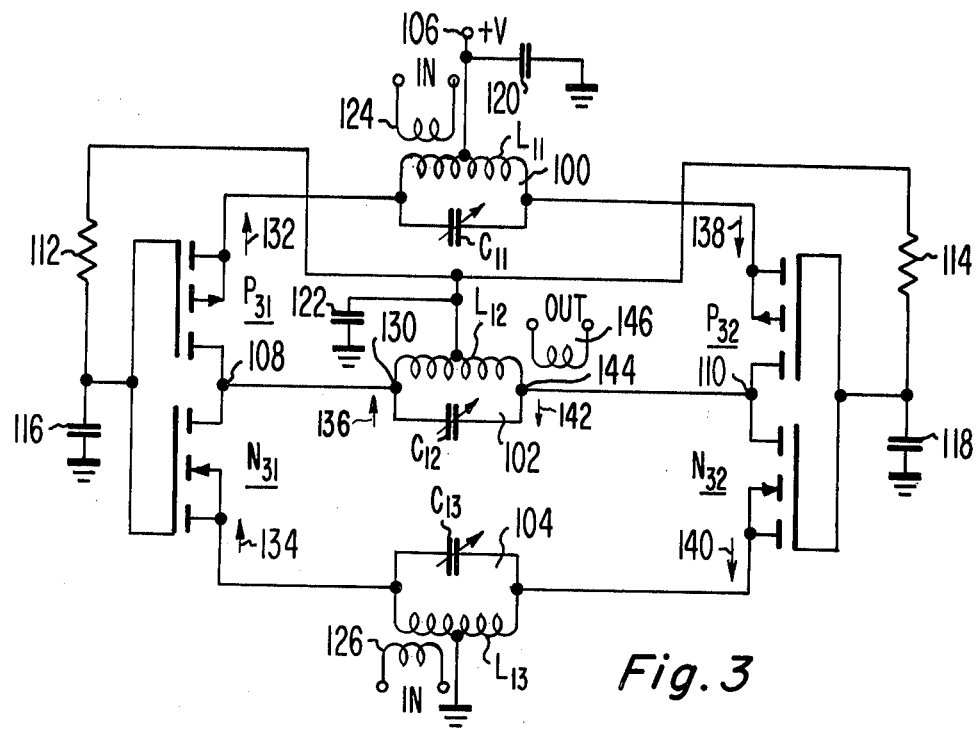
FIG. 3 is a schematic circuit diagram of a third embodiment of the invention, this one comprising a common-gate bridge amplifier.

The amplifier of FIG. 3 comprises two COS/MOS pairs $P_{31}$, $N_{31}$ and $P_{32}$, $N_{32}$, respectively. The circuit also includes three parallel resonant circuits. The first such circuit 100 is connected between the source electrodes of transistors $P_{31}$ and $P_{32}$, respectively. The second parallel resonant circuit 102 is connected between the joined drain electrodes of one COS/MOS pair $P_{31}$, $N_{31}$ and the joined drain electrodes of the other COS/MOS pair $P_{32}$, $N_{32}$. The third parallel resonant circuit 104 is connected between the source electrodes of transistors $N_{31}$ and $N_{32}$.

Both COS/MOS pairs are quiescently biased at (+V/2). Quiescent current flows from the +V terminal 106 to the center tap of inductor $L_{11}$ and through this inductor via the conduction paths of transistors $P_{31}$, $N_{31}$ and $P_{32}$, $N_{32}$ to ground through the center tapped inductor $L_{13}$. Assuming that in the quiescent condition the P and N type transistors exhibit equal conduction path resistances, this places the nodes 108 and 110 at the joined drain electrodes of pairs $P_{31}$, $N_{31}$ and $P_{32}$, $N_{32}$, respectively, at a voltage (+V/2). This same voltage, therefore, is applied through the two halves of inductor $L_{12}$ and the two bias resistors 112 and 114, respectively, to the joined gate electrodes of pairs $P_{31}$, $N_{31}$ and $P_{32}$, $N_{32}$, respectively. The capacitors 116 and 118 place both pairs of joined gate electrodes at RF ground. The circuit, therefore, operates as a common-gate bridge amplifier.

The capacitors 120 and 122 act as by-pass capacitors for RF. The RC networks 112, 116, and 114, 118, serve as filters to attenuate the feedback of the vestigial RF output voltage developed across capacitor 122.

The circuit of FIG. 3 is capable of operation in a number of different modes. In one of these modes, there is only a single input signal and it is applied, in parallel, to the two primary input windings 124 and 126, respectively. These two windings are wound in a sense such that the source electrodes of transistors $P_{31}$ and $N_{31}$ are driven in phase. Similarly, the source electrodes of transistors $P_{32}$ and $N_{32}$ are driven in phase. However, as the two COS/MOS pairs are driven from opposite terminals of parallel resonant circuits, the signals applied to the pair $P_{31}$, $N_{31}$ are 180° out-of-phase with the signals applied to the pair $P_{32}$, $N_{32}$.

Assume that the source electrode of transistor $P_{31}$ is driven positively. This tends to cause heavier conduction through transistor $P_{31}$ and node 108 tends to go more positive. Concurrently, the source electrode of transistor $N_{31}$ is being driven positively and this tends to cause less conduction through transistor $N_{31}$, which also tends to drive the common drain electrode connection 108 more positive. Thus, terminal 130 of the output parallel resonant circuit 102 is driven in phase with the driving voltage applied to the source electrodes of the transistor pair $P_{31}$, $N_{31}$. This is indicated schematically by the arrows 132, 134, 136. In similar fashion, as indicated by arrows 138, 140 and 142, the opposite terminal 144 of the parallel resonant circuit 102, is driven in phase with the driving voltage applied to the source electrodes of transistor pair $P_{32}$, $N_{32}$ and 180° out-of-phase with the driving voltage applied to the terminal 130 of the parallel resonant circuit 102. Thus, the desired mode of operation is achieved. The output signal may be picked up by the secondary winding 146 which is coupled to the inductor $L_{12}$ of the output resonant circuit 102.

In the mode of operation just described, all three parallel resonant circuits 100, 102 and 104 are tuned to the same frequency which, in the particular use envisioned, is an RF frequency. In a second mode of operation, the circuit may be used as an RF mixer. Here, the two input signals applied to primary windings 124 and 126, respectively, are at different frequencies. As an example, one may be at an incoming radio frequency and the other at a local oscillator frequency. The parallel resonant circuits 100 and 104 are tuned to the respective input frequencies. The output resonant circuit 102 is tuned to the beat frequency between these two input frequencies. This beat frequency may be a difference frequency such as an intermediate frequency or it may be a sum frequency.

It is also possible to operate the circuit of FIG. 3 as a frequency multiplier. Here, as in the first mode of operation described for FIG. 3, a common input signal is applied to both primary windings 124 and 126. The input parallel resonant circuits 100 and 104 are tuned to the frequency of this signal. The output parallel resonant circuit 102, however, is tuned to an odd-multiple harmonic of this frequency. In use as a multiplier, it is expected that output frequencies up to of the order of 200 MHz can be produced.

The common source amplifier of FIG. 2 provides voltage gain. However, common source amplifiers, in general, become unstable at higher frequencies due to the excessive feedback resulting from drain-to-gate capacitances. It is for this reason that the neutralization network described is included in the FIG. 2 circuit. The common gate amplifier of FIG. 3 provides current gain (that is, power gain) and operates at higher frequencies than is the case when similar transistors are operated in the common source mode. The "grounded gate" isolates the swinging output-drain terminal from the swinging input-source terminal, resulting in enhanced stability at higher frequencies. The circuit of FIG. 4, which is described next, includes transistors, some of which are operated in the common gate configuration and others in the common source configuration.

Figure 4:
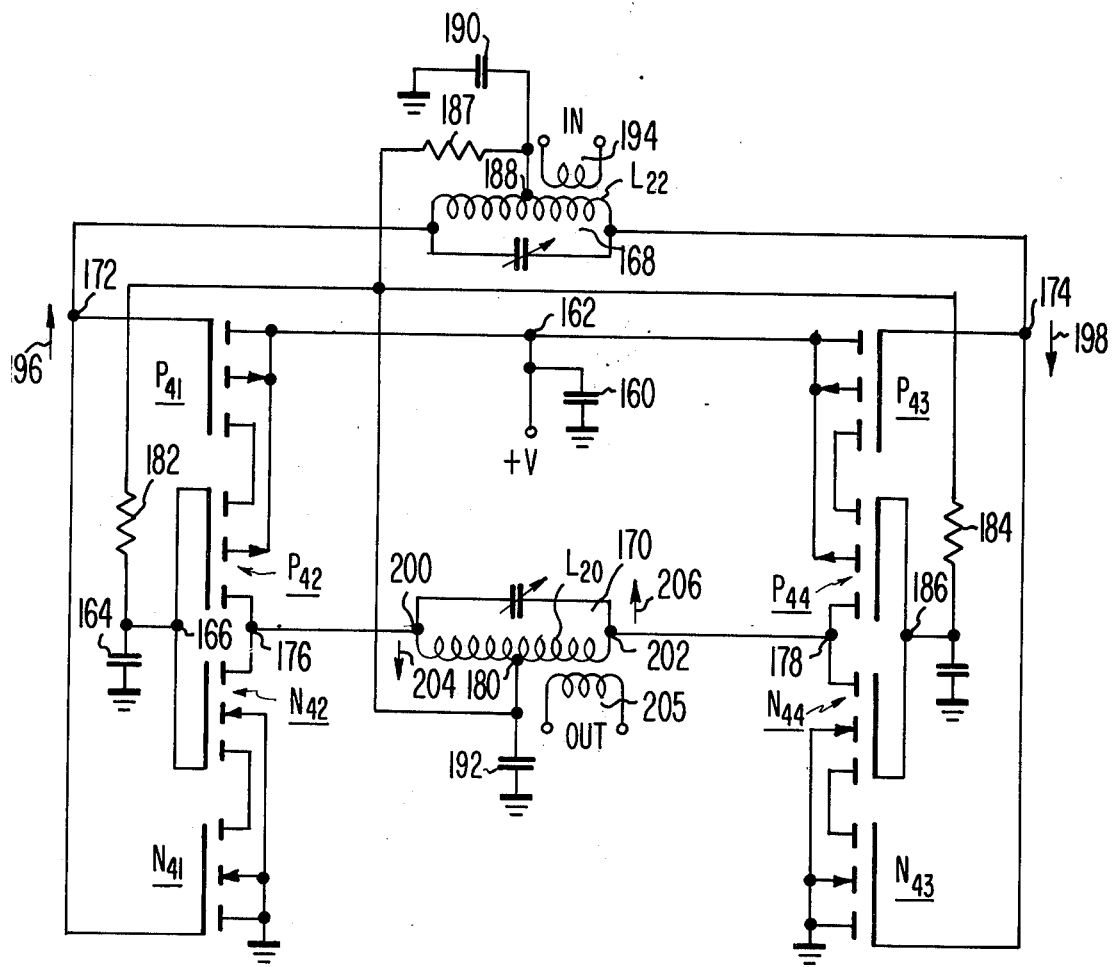
FIG. 4 is a schematic circuit diagram of a fourth embodiment of the invention, this one employing cascode-connected transistors.

The circuit of FIG. 4 comprises a bridge amplifier which includes two sets of cascode-connected transistors. The first set comprises four transistors $P_{41}$, $N_{41}$ and $P_{42}$, $N_{42}$ and the second set comprises transistors $P_{43}$, $N_{43}$ and $P_{44}$, $N_{44}$. Using the first set as an example, in the amplifier section comprising transistors $P_{41}$ and $P_{42}$, transistor $P_{41}$ is connected in the common-source mode by virtue of RF by-pass capacitor 160 connected between the common-source connection 162 and ground.

The second transistor $P_{42}$ is connected in common-gate configuration by virtue of the by-pass capacitor 164 connected between the common gate electrode connection 166 and ground. The N type transistors are similarly connected. Transistor $N_{41}$ is connected at its source electrode directly to ground. Transistor $N_{42}$ is connected at its gate electrode to the common gate connection terminal 166 and from there through RF by-pass capacitor 164 to ground. The second set of cascode-connected transistors is similarly connected in common-source and common-gate configuration.

The amplifier of FIG. 4 includes an input parallel resonant circuit 168 and an output parallel resonant circuit 170. The input circuit is connected between the common gate electrode connection 172 of transistors $P_{41}$ and $N_{41}$ and the common gate electrode connection 174 of the transistors $P_{43}$ and $N_{43}$. The output parallel resonant circuit 170 is connected between the common drain electrode connection 176 of transistors $P_{42}$ and $N_{42}$ and the common drain electrode connection 178 of the transistors $P_{44}$ and $N_{44}$.

All of the transistors are quiescently biased at $(+V/2)$. Assuming equal resistance of all conduction paths during the quiescent condition of the circuit, the common drain connections 176 and 178 quiescently are at $(+V/2)$ by virtue of current flow through each cascode of transistors. The $(+V/2)$ voltage is applied via the center tap 180 of inductor $L_{20}$ through resistors 182 and 184, respectively, to the common gate electrode connections 166 and 186, respectively. This same voltage is applied through resistor 187 and the center tap 188 of inductor $L_{22}$ to the common gate electrode connections 172 and 174, respectively, of transistors $P_{41}$, $N_{41}$ and $P_{43}$, $N_{43}$.

As already mentioned, capacitor 160 is an RF by-pass capacitor. Capacitors 190 and 192 are also RF by-pass capacitors. The three resistors 182, 184 and 187 serve not only as DC bias networks but also with their respective capacitors as resistor-capacitor networks to attenuate the vestiges of output signal which would otherwise tend to feed back from by-pass capacitor 192 to the input circuit.

In the operation of the circuit of FIG. 4, input signals are applied to primary winding 194. The parallel resonant circuit 168, which is tuned to the frequency of this signal, supplies 180° out-of-phase voltages to the two cascodes of transistors. This is indicated schematically by the arrows 196 and 198 at the common gate electrode connections 172 and 174, respectively. The two cascodes of transistors operate as inverters and produce out-of-phase components at the terminals 200 and 202, respectively, of the output parallel resonant circuit 170. This is indicated schematically by the arrows 204 and 206. The output parallel resonant circuit is tuned to the input signal frequency and it supplies an output signal to the output secondary winding 205.

Important features of the circuit of FIG. 4 are its improved high frequency stability and its high gain. The stability is enhanced by reducing the output circuit-to-input circuit feedback capacitance, for example between the drain electrode of transistor $P_{42}$ and the gate electrode of transistor $P_{41}$. The other sets of complementary transistors have similar isolation between these elements.

The circuit of FIG. 4 is also useful as a frequency multiplier. Here, the output parallel resonant circuit 170 is tuned to the desired odd multiple of the input frequency.

What is claimed is:

1. A bridge amplifier comprising, in combination:

first and second pairs of complementary field-effect transistors, each pair comprising an N-type transistor and a P-type transistor, each such transistor having an input, an output and a control electrode, the transistors of each pair being interconnected at their control electrodes, and interconnected at their output electrodes;

means for quiescently biasing each pair of transistors for linear operation, said means comprising two series-connected complementary field-effect transistors, and a feedback circuit responsive to current flow through said two transistors for applying a quiescent bias voltage to said interconnected control electrodes of said first and second pairs of transistors;

two input circuits, one coupled between the control and input electrodes of one pair, and the other coupled between the control and input electrodes of the other pair;

two operating voltage terminals, one said terminal coupled to the input electrodes of the P-type transistors and the other said terminal coupled to the input electrodes of the N-type transistors;

a load circuit coupled between the output electrodes of one pair of transistors and the output electrodes of the other pair of transistors; and means coupled between said two input circuits for applying an input signal in one phase to one pair of transistors and in opposite phase to the other pair of transistors.

2. A bridge amplifier as set forth in claim 1, wherein all of said input electrodes are alternating current coupled to a point of reference potential and wherein said means for applying an input signal comprises means for applying the same in one phase to the control electrodes of one pair of complementary transistors and in opposite phase to the control electrodes of the other pair of complementary transistors.

3. A bridge amplifier as set forth in claim 1, wherein all of said control electrodes are alternating current coupled to a point of reference potential and wherein said means for applying an input signal comprises means for applying the same in one phase to the input electrode of one of the transistors of one pair and in opposite phase to the input electrode of the corresponding transistor of the other pair.

4. A bridge amplifier as set forth in claim 3, wherein said means for applying an input signal further includes means for applying an input signal in said one phase to the input electrode of the other transistor of said one pair and in opposite phase to the input electrode of the corresponding transistor of the other pair.

5. A bridge amplifier as set forth in claim 4, wherein said means for applying an input signal comprises means for applying a signal of one frequency in one phase to the input electrode of one of the transistors of one pair and in opposite phase to the input electrode of the transistor of same conductivity type of the other pair, and means for applying a signal at a second frequency in one phase to the input electrode of the other transistor of said one pair and in opposite phase to the input electrode of the other transistor of the other pair.

6. A bridge amplifier as set forth in claim 1, wherein each of said transistors comprises an MOS transistor, said input, output and control electrodes comprising source, drain and gate electrodes, respectively; and wherein said two series-connected transistors of said means for biasing comprise said first pair of transistors.

7. A bridge amplifier as set forth in claim 1, wherein said means for applying an input signal comprises:

a third pair of complementary transistors of the same type as said first and second pairs of said transistors, the transistors of said third pair being interconnected at their control electrodes and at their output electrodes, said two operating voltage terminals being coupled one to the input electrode of the P-type transistor of said third pair and the other to the input electrodes of the N-type transistor of said third pair;

first resistive means connecting the output electrodes to the control electrodes of the transistors of said third pair for quiescently biasing the control electrodes of said third pair;

second resistive means;

means for applying an input signal to the control electrodes of the transistors of the first pair and through said second resistive means to the control electrodes of said third pair, the ratio of said first to said second resistive means being chosen to cause said third pair of transistors to operate as a unity gain amplifier;

means for applying the signal produced at the output electrodes of the transistors of said third pair to the input electrodes of the transistors of said second pair; and wherein said two series-connected field-effect transistors of said means for biasing comprises said third pair and wherein said means for quiescently biasing also includes said first and second resistive means.

8. A bridge amplifier as set forth in claim 7, wherein said load circuit comprises third resistive means.

9. A bridge amplifier as set forth in claim 1, wherein said means for applying an input signal comprises a parallel resonant circuit having first and second output terminals at which signal voltages of opposite phase are respectively produced, said first terminal being connected to the control electrodes of the transistors of said first pair and said second terminal being connected to the control electrodes of the transistors of said second pair.

10. A bridge amplifier as set forth in claim 9, wherein said load circuit comprises a second parallel resonant circuit having first and second output terminals at which signal voltages are produced which are out-of-phase with one another, said first terminal of said second parallel resonant circuit being connected to the output electrodes of said first pair of transistors and said second terminal of said second parellel resonant circuit being connected to the output electrodes of said second pair of transistors.

11. A bridge amplifier as set forth in claim 10, wherein said two parallel resonant circuits are tuned to the same frequency.

12. A bridge amplifier as set forth in claim 10, wherein said second parallel resonant circuit is tuned to a multiple of the frequency to which the other parallel resonant circuit is tuned.

13. A bridge amplifier as set forth in claim 1, wherein:

said means for applying an input signal comprises first and second parallel resonant circuits, each such circuit having a first terminal at which a signal of one phase is produced and a second terminal at which a signal of opposite phase is produced, said first terminal of the first resonant circuit being connected to the input electrode of the P-type transistor of the first pair and the second terminal of the first resonant circuit being connected to the input electrode of the P-type transistor of the said pair, the first terminal of the second parallel resonant circuit being connected to the input electrode of the N-type transistor of the first pair and the second terminal of the second parallel resonant circuit being connected to the input electrode of the N-type transistor of the second pair; and wherein said load circuit comprises a third parallel resonant circuit having first and second terminals, a signal of one phase being produced at said first terminal and of opposite phase at said second terminal when said circuit is producing an output signal, said first terminal of said third parallel resonant circuit being connected to the output electrodes of the transistors of the first pair and said second terminal of said third parallel resonant circuit being connected to the output electrodes of the transistors of the second pair.

14. A bridge amplifier as set forth in claim 13, wherein all of said control electrodes are alternating current connected to a point of reference potential.

15. A bridge amplifier as set forth in claim 14, wherein said means for applying an input signal further includes means for applying a common signal to both said first and said second parallel resonant circuits, said first and said second parallel resonant circuits being tuned to the frequency of said signal.

16. A bridge amplifier as set forth in claim 15, wherein said third parallel resonant circuit is tuned to the same frequency as said first and second parallel resonant circuits.

17. A bridge amplifier as set forth in claim 15, wherein said third parallel resonant circuit is tuned to a frequency which is an odd multiple of the frequency to which said first and second parallel resonant circuits are tuned.

18. A bridge amplifier as set forth in claim 14, wherein said means for applying an input signal comprises means for applying signal at one frequency to said first parallel resonant circuit, said first parallel resonant circuit being tuned to said frequency, and means for applying a signal at a second frequency to said second parallel resonant circuit, said second parallel resonant circuit being tuned to said second frequency and wherein said third parallel resonant circuit is tuned to a beat frequency of said first and said second frequencies.

19. A bridge amplifier as set forth in claim 1, further including:

third and fourth pairs of complementary transistors, each such pair comprising an N-type transistor and a P-type transistor, each such transistor having an input, an output and a control electrode, the transistors of the third pair being interconnected at their control electrodes and the transistors of the fourth pair being interconnected at their control electrodes, the P-type transistor of said third pair being connected at its output electrode to the input electrode of the P-type transistor of the first pair and the input electrode of the P-type transistor of the third pair being connected to one of said operating voltage terminals, the output electrode of the P-type transistor of said fourth pair being connected to the input electrode of the P-type transistor of said second pair and the input electrode of the P-type transistor of said fourth pair being connected to said one operating voltage terminal, the output electrode of the N-type transistor of said third pair being connected to the input electrode of the N-type transistor of the first pair and the input electrode of the N-type transistor of the third pair being connected to the other operating voltage terminal, the output electrode of the N-type transistor of the fourth pair being connected to the input electrode of the N-type transistor of the second pair and the input electrode of the N-type transistor of the fourth pair being connected to said other operating voltage terminal.

20. A bridge amplifier as set forth in claim 19, wherein the control electrodes of the first and second pairs of transistors are connected to RF ground and wherein the input electrodes of the third and fourth pairs of transistors are connected to RF ground.

21. A bridge amplifier as set forth in claim 20, wherein all of said transistors are MOS transistors.

22. A bridge circuit as set forth in claim 21, wherein, said load comprises a parallel-resonant circuit and said means for applying an input signal comprises a parallel resonant circuit.

23. An amplifier comprising, in combination:

two MOS transistors, one P-channel, and the other N-channel, each having source, drain and control electrodes, said control electrodes connected to a first terminal, and said drain electrodes connected to one another and to an output terminal;

first and second impedance means;

third and fourth terminals between which an operating voltage may be applied, said third terminal connected via said first impedance means to the source electrode of the P-channel transistor and said fourth terminal connected via said second impedance means to the source electrode of the N-channel transistor;

means connecting said first terminal to ground;

first means for applying an input signal between the source electrode of said P-channel transistor and ground; and second means for applying an input signal between the source electrode of said N-channel transistor and ground.

24. An amplifier as set forth in claim 23, wherein said first and said second means for applying input signals comprise means for applying signals at the same frequency and in phase to said two source electrodes.

25. An amplifier as set forth in claim 24, wherein said first and said second means for applying input signals comprise means for applying signals at two different frequencies to said two source electrodes, respectively; and further including a circuit tuned to a beat frequency between these two frequencies coupled between said output terminal and another circuit point.

26. In an amplifier:

first and second terminals for receiving operating voltages;

first and second sets of transistors, each set comprising four MOS transistors, the first and second transistors of P-type and the third and fourth transistors of N-type, each such transistor having source, drain and gate electrodes, and each having a conduction path between its source and drain electrodes, the conduction paths of said first, second, third and fourth transistors being connected in series between said terminals, in the order named, with the source electrode of the P-type first transistor connected to said first terminal, the source electrode of said N-type fourth transistor connected to said second terminal, the drain electrode of the P-type first transistor connected to the source electrode of the P-type second transistor, the drain electrode of the P-type second transistor connected to the drain electrode of the N-type third transistor, and the source electrode of the N-type third transistor connected to the drain electrode of the N-type fourth transistor;

means connecting the gate electrodes of said second and third transistors of each set to alternating current ground;

means connecting the source electrodes of said first and fourth transistors of each set to alternating current ground;

a first input signal terminal connected to the gate electrodes of said first and fourth transistors of the first set;

a second input signal terminal connected to the gate electrodes of the first and fourth transistors of the second set;

means for applying a signal in one phase to said first input terminal and in opposite phase to said second input terminal; and two output terminals, one at the drain electrode connection between the second and third transistors of said first set and the other at the drain electrode connection between the second and third transistors of said second set.

27. In an amplifier as set forth in claim 26, further including:
a load circuit connected between said output terminals.

28. In an amplifier as set forth in claim 27, said load circuit comprising a parallel-resonant circuit.

29. In an amplifier as set forth in claim 28, said means for applying signals to the first and second input terminals comprising respective opposite nodes of a second parallel-resonant circuit.

30. An amplifier as set forth in claim 23, further including:
means coupled between said output terminal and said first terminal, responsive to quiescent direct current flow through said transistors for applying a bias voltage to said control electrodes.

31. An amplifier as set forth in claim 1, wherein said two series-connected transistors comprise MOS transistors, each having source, gate and drain electrodes, said transistors being interconnected at their drain electrodes and interconnected at their gate electrodes, one of said transistors being connected at its source electrode to one of said operating voltage terminals and the other transistor being connected at its source electrode to the other of said operating voltage terminals, and said feedback connection comprising resistive means connected between said interconnected drain electrodes and said interconnected gate electrodes.

32. A bridge amplifier comprising:
first and second supply voltage terminals for receiving first and second supply voltages, respectively;
first, second and third P-channel field-effect transistors and first, second and third N-channel field-effect transistors, each said transistor having drain, source and gate electrodes, the source electrodes of said P-channel field-effect transistors being connected to said first supply terminal, and the source electrodes of said N-channel transistors being connected to said second supply terminal;

means connecting said first P-channel and said first N-channel field-effect transistors as a first inverting amplifier stage, including an input connection for said first inverting amplifier stage at an interconnection of their gate electrodes and including an output interconnection for said first inverting amplifier stage at an interconnection of their drain electrodes;

means connecting said second P-channel and said second N-channel field-effect transistors as a second inverting amplifier stage, including an input connection for said second inverting amplifier stage at an interconnection of their gate electrodes and including an output connection for said second inverting amplifier stage at an interconnection of their drain electrodes;

means connecting said third P-channel and said third N-channel field-effect transistors as a third inverting amplifier stage, including an input connection for said third inverting amplifier stage at an interconnection of their gate electrodes and including an output connection for said third inverting amplifier stage at an interconnection of their drain electrodes;

an input signal terminal;

means for AC coupling said input signal terminal to a point of interconnection;

first and second output signal terminals at the output connections of said second and third inverting amplifiers, respectively;

first resistive means coupling said point of interconnection to said input connection of said first inverting amplifier stage;

second resistive means coupling said input connection to said output connection of said first inverting amplifier stage, thereby providing a direct coupled voltage feedback connection tending to adjust the quiescent potentials at the output and input connections of said first inverting amplifier stage and at said point of interconnection to be midway between said first and second voltages;

means connecting said point of interconnection to the input connection of said second inverting amplifier stage for applying thereto signal variations appearing at said input signal terminal superimposed on the quiescent potential at said point of interconnection; and means connecting the output connection of said first inverting amplifier stage to the input connection of said third inverting amplifier stage for applying thereto said signal variations of the opposite sense superimposed on the quiescent potential at the output connection of said first inverting amplifier stage.

33. An amplifier comprising:
first and second supply terminals for receiving first and second supply voltages, respectively;
first and second P-channel field-effect transistors and first and second N-channel field-effect transistors, each said transistor having drain, source and gate electrodes, the source electrodes of said P-channel field-effect transistors being connected to said first supply terminal, and the source electrodes of said N-channel transistors being connected to said second supply terminal;

source potential of said other transistor at a prescribed value, for supplying an input signal to the source electrode of said other transistor, whereby said load circuit will be supplied an output signal which is related to the sum of the input signals.

41. An amplifier as set forth in claim 40 in combination with first and second transformers having respective input windings for receiving signals to be applied to said amplifier and having respective secondary windings, one of said sources and wherein said input signal supply means comprises at least a portion of the secondary winding of said first transformer connecting said first supply terminal and the source electrode of said first P-channel transistor, and at least a portion of the secondary winding of said second transformer connecting said second supply terminal and the source electrode of said first N-channel transistor.

42. An amplifier as set forth in claim 39, further including:
   second P-channel and second N-channel field-effect transistors having respective source, drain and gate electrodes and exhibiting respective conduction characteristics that are complementary to each other, said transistors being interconnected at their drain electrodes and being interconnected at their gate electrodes;
   means connected between said first supply terminal and the source electrode of said second P-channel transistor for maintaining the quiescent source potential of said second P-channel transistor at a prescribed voltage relative to said relatively positive supply voltage;
   means connected between said second supply terminal and the source electrode of said second N-channel transistor, for maintaining the quiescent source potential of said second N-channel transistor at a prescribed voltage relative to said relatively negative supply voltage;
   second input signal supply means, including at least a portion of one of said means for maintaining the quiescent source potential of a second transistor at a prescribed value, for supplying an input signal to the source electrode of that second transistor;
   means connecting said interconnected drain electrodes of said first transistors to said load circuit; and
   second low-pass filter means having an input connected to which said interconnected drain electrodes of said second P-channel and said second N-channel transistors connect and having an output connected to which said interconnected gate electrodes of said second P-channel and second transistors connects, for applying direct-coupled degenerative drain-to-gate feedback to each of said first P-channel and second N-channel transistors, whereby these transistors operate to tend to stabilize the quiescent potential at the interconnection between their drain electrodes to a value midway between said relatively positive and relatively negative supply voltages.

43. An amplifier comprising:
   first and second supply terminals for receiving relatively positive and relatively negative supply voltages, respectively;
   first and second N-channel field-effect transistors and third and fourth P-channel field-effect transistors, each transistor having source, drain and gate electrodes;
   a first pair of direct current conductive means respectively connecting the source electrodes of said first and second P-channel transistors to said first supply terminal;
   a second pair of direct current conductive means respectively connecting the source electrodes of said first and second N-channel transistors to said second supply terminal;
   means for applying push-pull input signal variations to the source electrodes of the first and second transistors, respectively, of one channel type, said means being associated with at least one pair of said direct current conductive means for applying push-pull input signals to the source electrodes of the transistors to which that pair of direct current conductive means connects;
   a center-tapped output circuit means having a first terminal at an interconnection of the drain electrodes of said first N-channel and first P-channel transistors, having a second terminal at an interconnection of the drain electrodes of said second N-channel and second P-channel transistors, each having a center tap, and having respective direct current conduction paths between its center tap and each of its first and second terminals; and
   low-pass filter means having an input connection at the center tap of said output circuit and having output connections to the gate electrodes of each of said first and second N-channel and first and second P-channel transistors, thereby comprising direct-coupled drain-to-gate feedback connections of each of those transistors for regulating their quiescent drain potentials to be midway between said first and second supply voltages.

44. An amplifier for supplying output signals to a load circuit, said amplifier comprising, in combination:
   first and second supply terminals for receiving relatively positive and relatively negative supply voltages, respectively;
   first P-channel and first N-channel field-effect transistors having respective source, drain and gate electrodes and exhibiting respective conduction characteristics that are complementary to each other, the source electrodes of said first P-channel and first N-channel transistors being respectively connected to said first supply terminal and to said second supply terminal;
   second P-channel and second N-channel field-effect transistors having respective source, drain and gate electrodes and exhibiting respective conduction characteristics that are complementary to each other, the source electrodes of said second P-channel and second N-channel transistors being connected to the drain electrode of said first P-channel transistor and to the drain electrode of said first N-channel transistor;
   means for connecting an interconnection of the drain electrodes of said second P-channel and second N-channel field-effect transistors to said load circuit;
   low-pass filter means having an input connection to which said interconnection between the drain electrodes of said second P-channel and second N-channel transistors connect and having a plurality of output connections;
   respective direct current conductive means connecting respective output connections of said low-pass filter means to each of the gate electrodes of said a center-tapped output circuit means having a first terminal, a second terminal, and a center tap therebetween, and having respective direct current conduction paths between its center tap and each of its first and second terminals;

first direct current conductive means between the drain electrode of said first P-channel transistor and the first terminal of said center-tapped output circuit means;

second direct current conductive means between the drain electrode of said first N-channel transistor and the first terminal of said center-tapped output circuit means;

third direct current conductive means between the drain electrode of said second P-channel transistor and the second terminal of said center-tapped output circuit means;

fourth direct current conductive means between the drain electrode of said second N-channel transistor and the second terminal of said center-tapped output circuit means;

a center-tapped input circuit means having a first terminal connected to an interconnection between the gate electrodes of said first P-channel and first N-channel transistors, a second terminal connected to an interconnection between the gate electrodes of said second P-channel and second N-channel transistors, and a center tap, and having respective direct current conduction paths between said center tap and each of its first and second terminals; and a direct coupled feedback connection from the center tap of said output circuit means to the center tap of said input circuit means, for tending to stabilize both the quiescent potential at the interconnection between the drain electrodes of said first N-channel and first P-channel transistors and the quiescent potential at the interconnection between the drain electrodes of said second P-channel and second N-channel transistors to values substantially midway between said first and second supply voltages.

34. An amplifier as set forth in claim 33 wherein said direct coupled feedback connection comprises low-pass filter means.

35. An amplifier as set forth in claim 34 wherein said low-pass filter means comprises a resistive path between the center tap of said input and output circuit means and capacitive means by-passing at least one point along said resistive path to ground.

36. An amplifier as set forth in claim 33 wherein each of said first, second, third and fourth direct current conductive means consists of a direct connection without substantial impedance.

37. An amplifier as set forth in claim 33 further including:

a third P-channel field-effect transistor having a source electrode connected to the drain electrode of said first P-channel transistor, having a drain electrode connected to the first terminal of said output circuit, and having a gate electrode;

a third N-channel field-effect transistor having a source electrode connected to the drain electrode of said first N-channel transistor, having a drain electrode connected to the first terminal of said output circuit, and having a gate electrode;

a fourth P-channel field-effect transistor having a source electrode connected to the drain electrode of said second P-channel transistor, having a drain electrode connected to the second terminal of said output circuit, and having a gate electrode;

a fourth N-channel field-effect transistor having a source electrode connected to the drain electrode of said second N-channel transistor, having a drain electrode connected to the second terminal of said output circuit, and having a gate electrode; and means for applying the quiescent potential appearing at the center tap of said output circuit to the gate electrodes of said third P-channel, third N-channel, fourth P-channel and fourth N-channel transistors.

38. An amplifier as set forth in claim 37 wherein said means for applying includes:

first low-pass filtering means having an input connection coupled to the center tap of said output circuit and having an output connection to the interconnected gate electrodes of said third P-channel and third N-channel transistors; and second low-pass filtering means having an input connection coupled to the center tap of said output circuit and having an output connection to the interconnected gate electrodes of said fourth P-channel and fourth N-channel transistors.

39. An amplifier for supplying output signals to a load circuit, said amplifier comprising, in combination:

first and second supply terminals for receiving relatively positive and relatively negative supply voltages, respectively;

first P-channel and first N-channel field-effect transistors having respective source, drain and gate electrodes and exhibiting respective conduction characteristics that are complementary to each other, said transistors being interconnected at their drain electrodes and being interconnected at their gate electrodes;

means connected between said first supply terminal and the source electrode of said first P-channel transistor for maintaining the quiescent source potential of said first P-channel transistor at a prescribed voltage relative to said relatively positive supply voltage;

means connected between said second supply terminal and the source electrode of said first N-channel transistor for maintaining the quiescent source potential of said first N-channel transistor at a prescribed voltage relative to said relatively negative supply voltage;

input signal supply means, including at least a portion of one of said means for maintaining the quiescent source potential of a transistor at a prescribed value, for supplying an input signal to the source electrode of that transistor;

means connecting said interconnected drain electrodes of said transistors to said load circuit;

first low-pass filter means having an input connection to which said interconnected drain electrodes connect and an input connection to which said interconnected gate electrodes conduct, for applying direct-coupled degenerative drain-to-gate feedback to each of said first P-channel and first N-channel transistors, whereby these transistors operate to tend to stabilize the quiescent potential at the interconnection between their drain electrodes to a value midway between said relatively positive and relatively negative supply voltages.

40. An amplifier as set forth in claim 39 wherein both said input signal supply means, including also at least a portion of the means for maintaining the quiescent first P-channel, first N-channel, second P-channel, and second N-channel transistors; and
input signal source means included in at least one of said direct current conductive means connecting an output connection of said low-pass filter means to the gate electrodes of said first P-channel and first N-channel transistors.

* * * * *

UNITED STATES PATENT AND TRADEMARK OFFICE
CERTIFICATE OF CORRECTION

PATENT NO. : 4,117,415

DATED : September 26, 1978

INVENTOR(S) : Merle Vincent Hoover

It is certified that error appears in the above-identified patent and that said Letters Patent is hereby corrected as shown below:

Column 8, claim 10, line 8, "parellel" should be --parallel--.

Column 9, claim 13, line 11, "said" should be --second--.

Signed and Sealed this

Twenty-ninth Day of May 1979

[SEAL]

Attest:

RUTH C. MASON
Attesting Officer

DONALD W. BANNER
Commissioner of Patents and Trademarks